(12) United States Patent
Okamura

(10) Patent No.: US 11,565,287 B2
(45) Date of Patent: Jan. 31, 2023

(54) SUBSTRATE PROCESSING APPARATUS, SUBSTRATE PROCESSING METHOD AND COMPUTER-READABLE RECORDING MEDIUM

(71) Applicant: TOKYO ELECTRON LIMITED, Tokyo (JP)

(72) Inventor: Motohiro Okamura, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/514,098

(22) Filed: Oct. 29, 2021

(65) Prior Publication Data

US 2022/0048082 A1 Feb. 17, 2022

Related U.S. Application Data

(62) Division of application No. 16/282,788, filed on Feb. 22, 2019, now Pat. No. 11,207,717.

(30) Foreign Application Priority Data

Feb. 27, 2018 (JP) .............................. JP2018-033397

(51) Int. Cl.
B08B 9/027 (2006.01)
B08B 3/08 (2006.01)
H01L 21/67 (2006.01)
H01L 21/687 (2006.01)

(52) U.S. Cl.
CPC ................ *B08B 9/027* (2013.01); *B08B 3/08* (2013.01); *H01L 21/67017* (2013.01); *H01L 21/67023* (2013.01); *H01L 21/67051* (2013.01); *B08B 2209/027* (2013.01); *H01L 21/68714* (2013.01)

(58) Field of Classification Search
CPC ........................... B08B 9/027; B08B 2209/027
See application file for complete search history.

(56) References Cited

U.S. PATENT DOCUMENTS

| 4,381,443 A | 4/1983 | Guibert |
| 2011/0308626 A1 | 12/2011 | Ogata et al. |
| 2014/0026927 A1 | 1/2014 | Ogata et al. |
| 2017/0008044 A1 | 1/2017 | Okumura et al. |

FOREIGN PATENT DOCUMENTS

| JP | 2013128015 A | 6/2013 |
| KR | 20050063388 A | 6/2005 |

*Primary Examiner* — Natasha N Campbell
(74) *Attorney, Agent, or Firm* — Nath, Goldberg & Meyer; Jerald L. Meyer; Tanya E. Harkins

(57) ABSTRACT

There is provided a substrate processing apparatus which includes: an exhaust pipe configured to selectively discharge an exhaust gas generated by a substrate process to a first pipe or a second pipe; a liquid supply part configured to supply a cleaning liquid to the exhaust pipe; a discharge destination setting part configured to set a discharge destination of the exhaust gas to the first pipe or the second pipe by rotating the exhaust pipe; and a controller configured to control the discharge destination setting part to rotate the exhaust pipe. The controller is further configured to control the liquid supply part to supply the cleaning liquid to the rotating exhaust pipe.

7 Claims, 9 Drawing Sheets

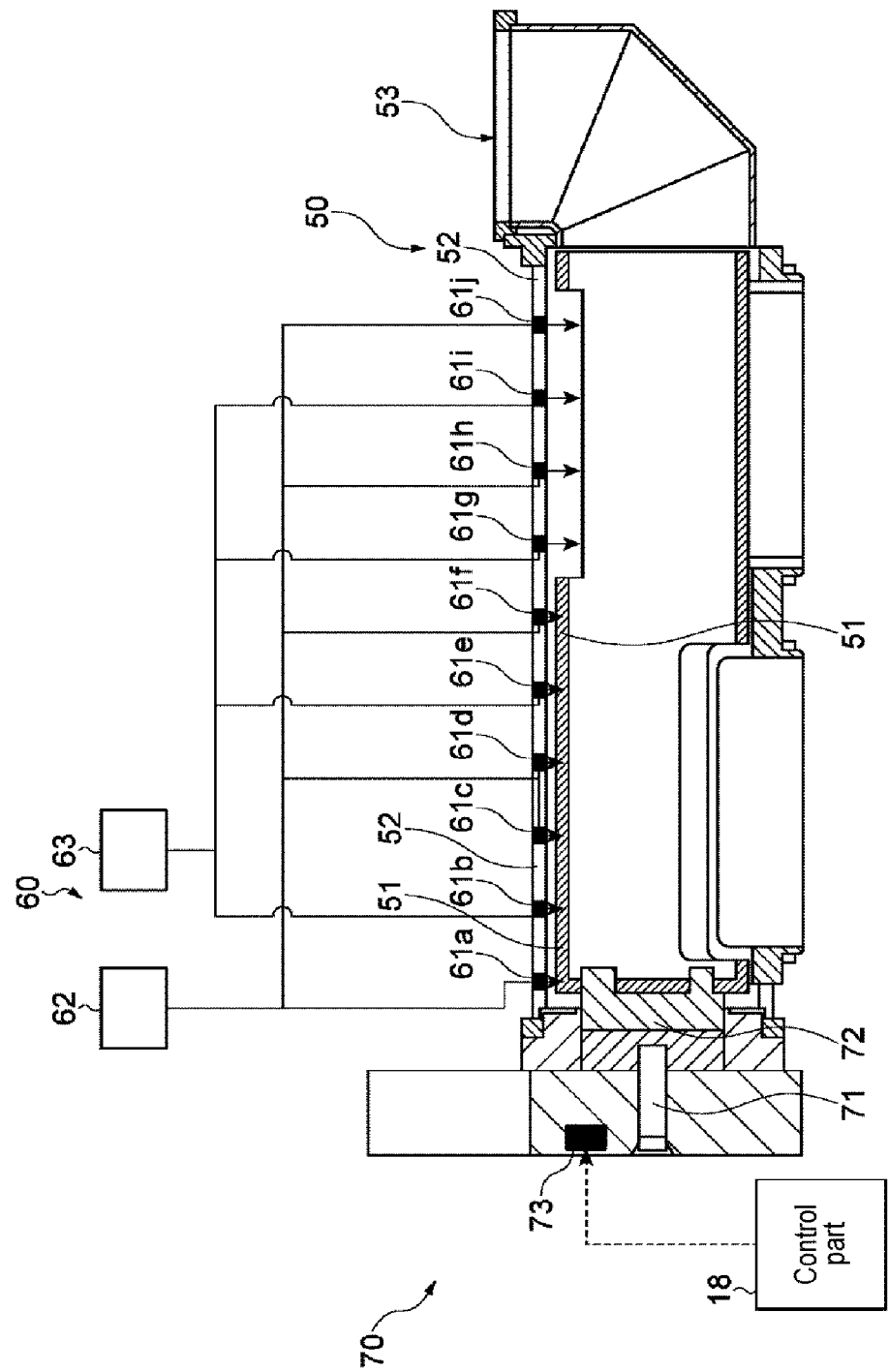

SUBSTRATE PROCESSING APPARATUS, SUBSTRATE PROCESSING METHOD AND COMPUTER-READABLE RECORDING MEDIUM

CROSS-REFERENCE TO RELATED APPLICATION

This is a Divisional Application of U.S. patent application Ser. No. 16/282,788, filed Feb. 22, 2019, an application claiming benefit from Japanese Patent Application No. 2018-033397, filed on Feb. 27, 2018, the entire contents of each of which are incorporated herein by reference.

TECHNICAL FIELD

The present disclosure relates to a substrate processing apparatus, a substrate processing method, and a non-transitory computer-readable recording medium.

BACKGROUND

There is a known liquid treatment apparatus that supplies various chemical liquids and rinse liquids onto a substrate to remove deposits (for example, a resist film, a contaminant, an oxide film, etc.) adhering to the substrate. This apparatus includes a rotary driving part that rotates the substrate while holding the substrate, a nozzle that supplies a chemical liquid or a rinse liquid to the substrate, and a cup that surrounds the periphery of the substrate held by the rotary driving part and to receive the liquid supplied from the nozzle onto the substrate.

The above-described apparatus includes an exhaust pipe for discharging an exhaust gas generated by liquid treatment to the outside. The exhaust pipe discharges the exhaust gas to an external pipe corresponding to, for example, the property (acidic or alkaline property) of the chemical liquid supplied to the substrate. The exhaust pipe is configured such that the external pipe (discharge destination of the exhaust gas) communicating with the exhaust pipe can be switched by, for example, a rotating the exhaust pipe. However, deposits (for example, crystals formed through a reaction of an acidic chemical liquid with an alkaline chemical liquid) associated with the discharge of the exhaust gas may sometimes adhere to the side surface (outer circumferential surface) or the like of the exhaust pipe. Generally, it is difficult to effectively clean such deposits. A process for periodically cleaning the deposits is sometimes performed, which in turn inhibits an efficient substrate process.

SUMMARY

Some embodiments of the present disclosure provide a substrate processing apparatus and a substrate processing method which are capable of effectively cleaning deposits adhering to an exhaust pipe, and a non-transitory computer-readable recording medium.

According to one embodiment of the present disclosure, there is provided a substrate processing apparatus comprising: an exhaust pipe configured to selectively discharge an exhaust gas generated by a substrate process to a first pipe or a second pipe; a liquid supply part configured to supply a cleaning liquid to the exhaust pipe; a discharge destination setting part configured to set a discharge destination of the exhaust gas to the first pipe or the second pipe by rotating the exhaust pipe; and a controller configured to control the discharge destination setting part to rotate the exhaust pipe. The controller is further configured to control the liquid supply part to supply the cleaning liquid to the rotating exhaust pipe.

According to another embodiment of the present disclosure, there is provided a substrate processing method which includes: rotating an exhaust pipe configured to exhaust an exhaust gas generated by a substrate process, so as to set a discharge destination of the exhaust gas to a first pipe or a second pipe; and discharging a liquid to the exhaust pipe under rotation so as to clean the exhaust pipe.

According to another embodiment of the present disclosure, there is provided a non-transitory computer-readable recording medium storing a program that causes a substrate processing apparatus to execute the aforementioned substrate processing method.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIG. 5 illustrates a sectional view of the exhaust pipe.

DETAILED DESCRIPTION

Figure 1:
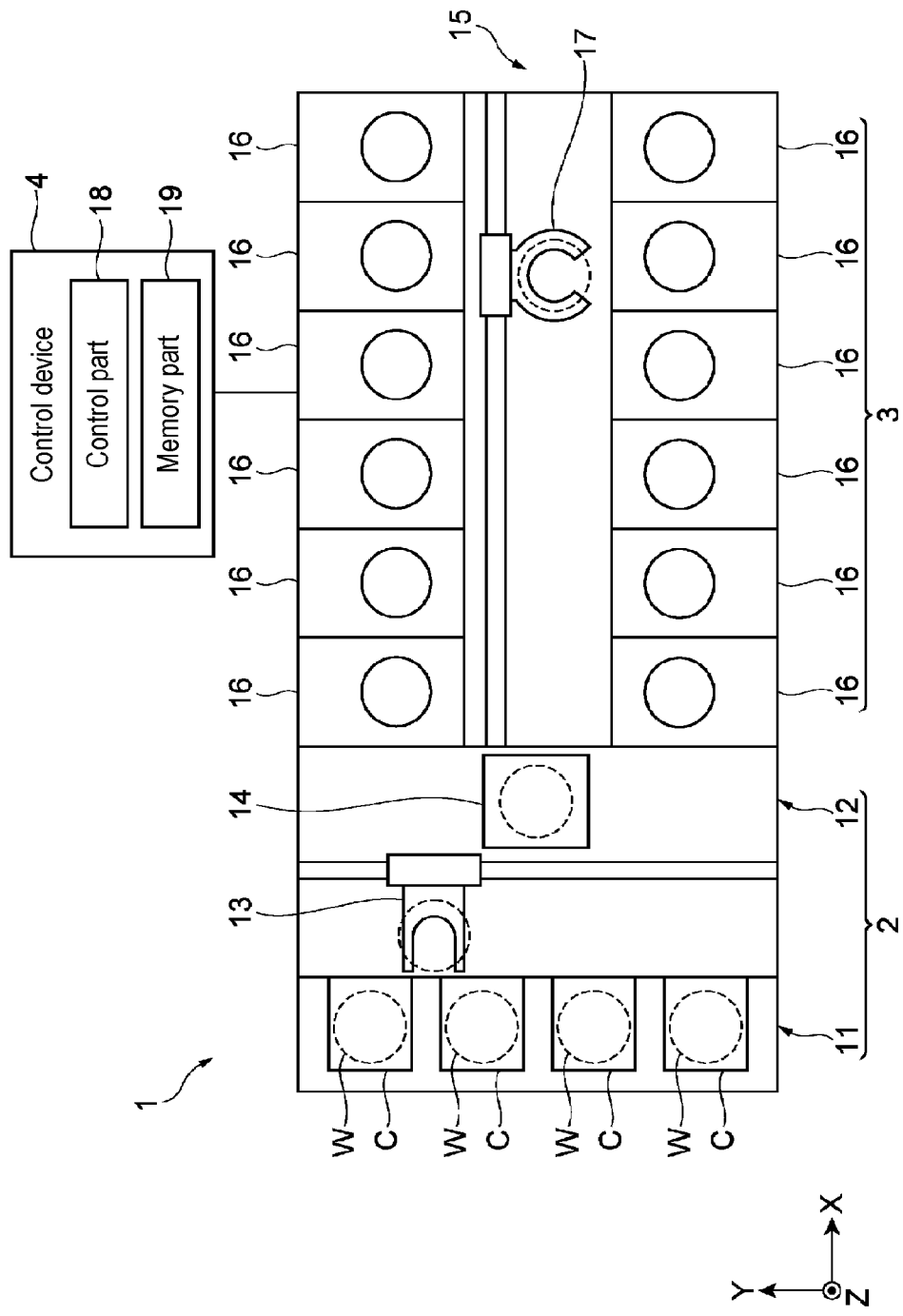
FIG. 1 illustrates a plan view schematically showing a substrate processing system.

Embodiments of the present disclosure to be described below are examples for describing the present disclosure, and the present disclosure is not limited to the following contents. In the following description, like reference numerals refer to the same elements or configurations and explanation thereof will not be repeated. Further, in the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Configuration of Substrate Processing System]

FIG. 1 illustrates a view showing a schematic configuration of a substrate processing system according to the present embodiment. In the following description, in order to clarify the positional relationship, an X-axis, a Y-axis and a Z-axis orthogonal to each other are defined. A positive Z-axis direction is defined as a vertical upward direction.

As shown in FIG. 1, the substrate processing system 1 includes a loading/unloading station 2 and a processing station 3. The loading/unloading station 2 and the processing station 3 are provided adjacent to each other.

The loading/unloading station 2 includes a carrier mounting part 11 and a transfer part 12. A plurality of carriers C for accommodating a plurality of substrates, e.g., semiconductor wafers (hereinafter referred to as wafers W) in the present embodiment in a horizontal posture, is mounted on the carrier mounting part 11.

The transfer part 12 is provided adjacent to the carrier mounting part 11, and includes a substrate transfer device 13 and a delivery part 14 disposed therein. The substrate transfer device 13 includes a wafer holding mechanism for holding the wafer W. Furthermore, the substrate transfer device 13 is capable of moving in the horizontal direction and the vertical direction and capable of turning about a vertical axis. The substrate transfer device 13 transfers the wafer W between the carrier C and the delivery part 14 using the wafer holding mechanism.

The processing station 3 is provided adjacent to the transfer part 12. The processing station 3 includes a transfer part 15 and a plurality of processing units 16. The processing units 16 are provided side by side at both sides of the transfer part 15.

The transfer part 15 includes a substrate transfer device 17 disposed therein. The substrate transfer device 17 includes a wafer holding mechanism for holding the wafer W. Furthermore, the substrate transfer device 17 is capable of moving in the horizontal direction and the vertical direction and capable of turning about a vertical axis. The substrate transfer device 17 transfers the wafer W between the delivery part 14 and the processing units 16 using the wafer holding mechanism.

The processing unit 16 performs a predetermined substrate process on the wafer W transferred by the substrate transfer device 17.

Furthermore, the substrate processing system 1 includes a control device 4. The control device 4 is, for example, a computer, and includes a control part 18 and a memory part 19. A program for controlling various processes executed in the substrate processing system 1 is stored in the memory part 19. The control part 18 controls the operation of the substrate processing system 1 by reading out and executing the program stored in the memory part 19.

Such a program may be recorded in a non-transitory storage medium readable by a computer and may be installed in the memory part 19 of the control device 4 from the storage medium. Examples of the computer-readable storage medium include a hard disk (HD), a flexible disk (FD), a compact disk (CD), a magneto-optical disk (MO), a memory card and the like.

In the substrate processing system 1 configured as above, first, the substrate transfer device 13 of the loading/unloading station 2 takes out the wafer W from the carrier C mounted on the carrier mounting part 11 and mounts the taken-out wafer W on the delivery part 14. The wafer W mounted on the delivery part 14 is taken out from the delivery part 14 by the substrate transfer device 17 of the processing station 3 and is loaded into the processing unit 16.

The wafer W loaded into the processing unit 16 is processed by the processing unit 16, then unloaded from the processing unit 16 by the substrate transfer device 17, and mounted on the delivery part 14. Subsequently, the processed wafer W mounted on the delivery part 14 is returned to the carrier C of the carrier mounting part 11 by the substrate transfer device 13.

[Configuration of Substrate Processing Apparatus]

Next, the configuration of the substrate processing apparatus 10 included in the substrate processing system 1 will be described with reference to FIG. 2. The substrate processing apparatus 10 uses a wafer W (substrate) having a film F formed on its surface as a processing target and performs a process of removing the film F from a peripheral portion Wc (a portion in the vicinity of the periphery) of the wafer W.

The wafer W may have a disk shape or a plate shape other than a circle such as a polygonal shape or the like. The wafer W may have a cutout portion which is partially cut out. The cutout portion may be, for example, a notch (a groove having a U shape, a V shape or the like), or a linear portion extending linearly (so-called orientation flat). The wafer W may be, for example, a semiconductor substrate, a glass substrate, a mask substrate, an FPD (Flat Panel Display) substrate, or various other substrates. The diameter of the wafer W may be, for example, about 200 mm to 450 mm. Specific examples of the film F include a TiN film, an Al film, a tungsten film, a SiN film, a $SiO_2$ film, a polysilicon film, a thermal oxide film (Th—$O_x$) and the like.

The substrate processing apparatus 10 includes the processing unit 16 and the control device 4 for controlling the processing unit 16. The processing unit 16 includes a rotary holding part 21, liquid supply parts 22 to 25, a temperature adjustment part 26 and a cup 27. Furthermore, the processing unit 16 includes a blower (not shown). A down-flow is formed inside the processing unit 16 by the blower.

The rotary holding part 21 holds and rotates the wafer W. The rotary holding part 21 includes a holder 21a and a rotary driver 21b. The holder 21a operates based on an operation signal transmitted from the control part 18 of the control device 4 and holds the central portion of the wafer W in a substantially horizontal posture by, for example, vacuum attraction or the like. The rotary driver 21b is an actuator using, for example, an electric motor as a power source, and is connected to the holder 21a. The rotary driver 21b operates based on an operation signal transmitted from the control part 18 and rotates the holder 21a about a rotation axis Ax extending in the vertical direction. That is to say, the rotary holding part 21 rotates the wafer W about an axis (the rotation axis Ax) perpendicular to a front surface Wa of the wafer W in a state in which the posture of the wafer W is substantially horizontal.

In the present embodiment, the rotation axis Ax passes through the center of the wafer W having a circular shape. Therefore, the rotation axis Ax is also the central axis of the wafer W. In the present embodiment, the rotary holding part 21 rotates the wafer W at a predetermined number of revolutions clockwise or counterclockwise when viewed from above. The predetermined number of revolutions of the wafer W may be, for example, about 10 rpm to about 2,000 rpm.

Figure 2:
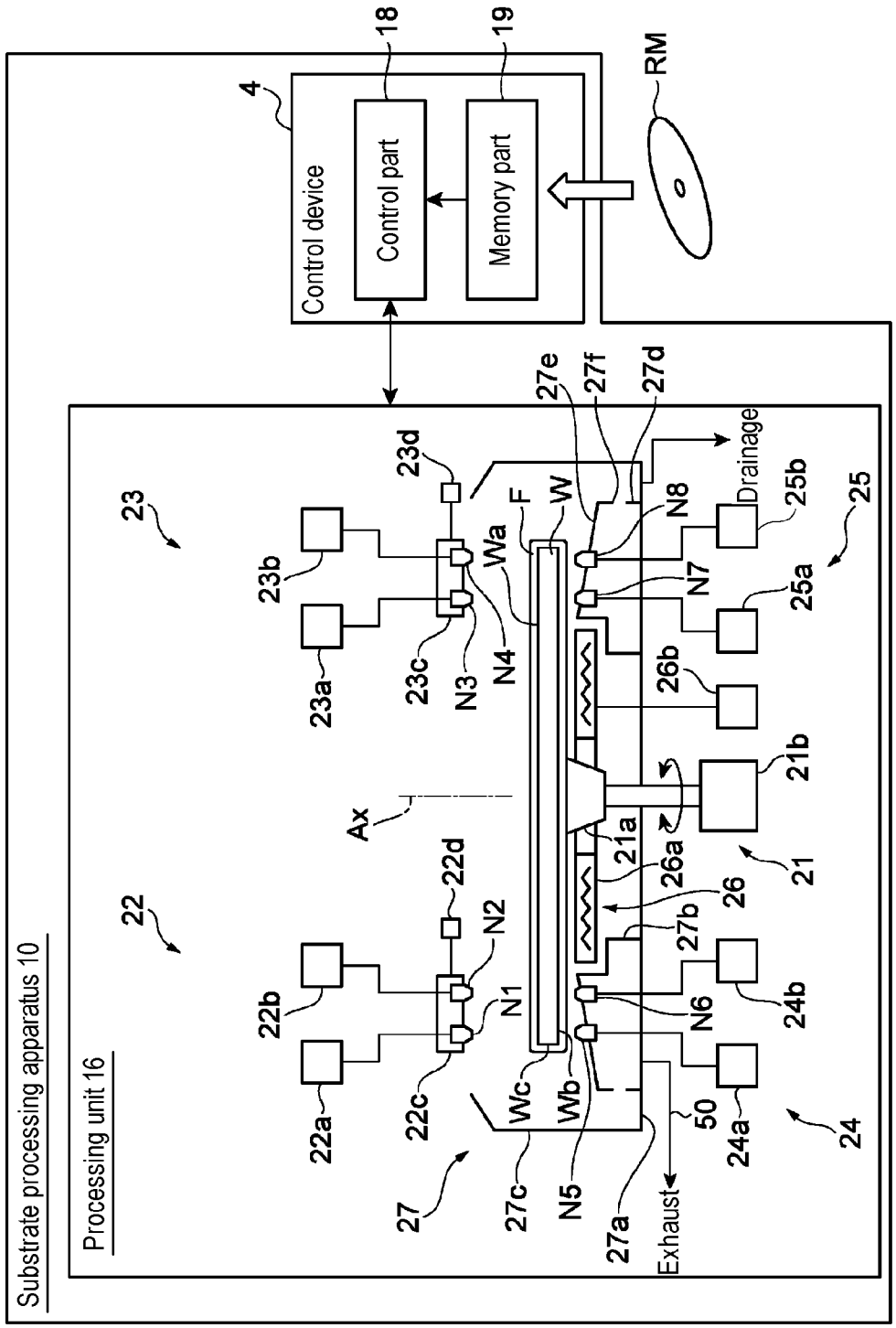
FIG. 2 illustrates a view showing a processing unit.

The liquid supply part 22 is configured to supply a chemical liquid and a rinse liquid toward the front surface Wa and the peripheral portion Wc of the wafer W at a predetermined process position (at the left side of the rotary holding part 21 and above the peripheral portion Wc of the wafer W in FIG. 2). The liquid supply part 22 includes a chemical liquid source 22a, a rinse liquid source 22b, a nozzle unit 22c for holding nozzles N1 and N2, and a driving mechanism 22d.

The chemical liquid source 22a operates based on an operation signal transmitted from the control part 18 and supplies a chemical liquid for dissolving the film F to the nozzle N1. Therefore, the chemical liquid is discharged from the nozzle N1 toward the front surface Wa of the wafer W. In some embodiments, the chemical liquid source 22a may include, for example, a chemical liquid tank, a pump for forcibly feeding the chemical liquid from the chemical liquid tank and a valve for controlling the ON/OFF of the flow of the chemical liquid, which are not shown herein.

Examples of the chemical liquid may include an alkaline chemical liquid, an acidic chemical liquid and the like. Examples of the alkaline chemical liquid may include a SC-1 liquid (a mixed liquid of ammonia, hydrogen peroxide and pure water), a hydrogen peroxide liquid and the like. Examples of the acidic chemical liquid may include a SC-2 liquid (a mixed liquid of hydrochloric acid, hydrogen peroxide and pure water), an HF liquid (hydrofluoric acid), a DHF liquid (diluted hydrofluoric acid), an $HNO_3$+HF liquid (a mixed liquid of nitric acid and hydrofluoric acid) and the like.

The rinse liquid source 22b operates based on an operation signal transmitted from the control part 18 and supplies a rinse liquid for washing away the chemical liquid and the dissolved component of the film F to the nozzle $N_2$. Therefore, the rinse liquid is discharged from the nozzle N2 toward the front surface Wa of the wafer W. In some embodiments, the rinse liquid source 22b may include, for example, a rinse liquid tank, a pump for forcibly feeding the rinse liquid from the rinse liquid tank, and a valve for controlling the ON/OFF of the flow of the rinse liquid, which are not shown herein. Examples of the rinse liquid may include pure water (DIW: deionized water) and the like.

The driving mechanism 22d operates based on an operation signal transmitted from the control part 18 and moves the nozzle unit 22c in a horizontal direction (in a radial direction of the wafer W).

The liquid supply part 23 is configured to supply the chemical liquid and the rinse liquid toward the front surface Wa and the peripheral portion Wc of the wafer W at a predetermined process position (at the right side of the rotary holding part 21 and above the peripheral portion Wc of the wafer W in FIG. 2). The liquid supply part 23 includes a chemical liquid source 23a, a rinse liquid source 23b, a nozzle unit 23c for holding nozzles N3 and N4, and a driving mechanism 23d. The chemical liquid source 23a, the rinse liquid source 23b, the nozzle unit 23c and the driving mechanism 23d have similar configurations as the chemical liquid source 22a, the rinse liquid source 22b, the nozzle unit 22c and the driving mechanism 22d, respectively. Thus, the descriptions thereof are omitted. In the present embodiment, the chemical liquid is discharged from the nozzle N3 toward the front surface Wa of the wafer W, and the rinse liquid is discharged from the nozzle N4 toward the front surface Wa of the wafer W. At least one of the chemical liquid source 23a and the chemical liquid source 22a may supply an alkaline chemical liquid. In addition, at least one of the chemical liquid source 23a and the chemical liquid source 22a may supply an acidic chemical liquid.

The liquid supply part 24 is configured to supply the chemical liquid and the rinse liquid toward a back surface Wb and the peripheral portion Wc of the wafer W at a predetermined process position (at the left side of the rotary holding part 21 and below the peripheral portion Wc of the wafer W in FIG. 2). The liquid supply part 24 includes a chemical liquid source 24a, a rinse liquid source 24b and nozzles N5 and N6.

The chemical liquid source 24a operates based on an operation signal transmitted from the control part 18 and supplies the chemical liquid for dissolving the film F to the nozzle N5. Therefore, the chemical liquid is discharged from the nozzle N5 toward the back surface Wb of the wafer W. In some embodiments, the chemical liquid source 24a may include, for example, a chemical liquid tank, a pump for forcibly feeding the chemical liquid from the chemical liquid tank and a valve for controlling the ON/OFF of the flow of the chemical liquid, which are not shown herein.

The rinse liquid source 24b operates based on an operation signal transmitted from the control part 18 and supplies the rinse liquid for washing away the chemical liquid and the dissolved component of the film F to the nozzle N6. Therefore, the rinse liquid is discharged from the nozzle N6 toward the back surface Wb of the wafer W. In some embodiments, the rinse liquid source 24b may include, for example, a rinse liquid tank, a pump for forcibly feeding the rinse liquid from the rinse liquid tank and a valve for controlling the ON/OFF of the flow of the rinse liquid, which are not shown herein.

The liquid supply part 25 is configured to supply the chemical liquid and the rinse liquid toward the back surface Wb and the peripheral portion Wc of the wafer W at a predetermined process position (at the right side of the rotary holding part 21 and below the peripheral portion Wc of the wafer W in FIG. 2). The liquid supply part 25 includes a chemical liquid source 25a, a rinse liquid source 25b and nozzles N7 and N8. The chemical liquid source 25a, the rinse liquid source 25b and the nozzles N7 and N8 have the similar configurations as the chemical liquid source 24a, the rinse liquid source 24b and the nozzles N5 and N6, respectively. Thus, the descriptions thereof are omitted. In the present embodiment, the chemical liquid is discharged from the nozzle N7 toward the back surface Wb of the wafer W, and the rinse liquid is discharged from the nozzle N8 toward the back surface Wb of the wafer W.

The temperature adjustment part 26 operates based on an operation signal transmitted from the control part 18 and is configured to heat the wafer W. The temperature adjustment part 26 includes a main body 26a and a gas source 26b. A heating source such as a resistance heater or the like is buried in the main body 26a. The main body 26a has an annular shape and surrounds the rotary holding part 21. Therefore, the main body 26a is positioned at the side of the back surface Wb of the wafer W in the state in which the wafer W is held by the rotary holding part 21.

The gas source 26b supplies an inert gas such as nitrogen or the like to the main body 26a. The inert gas supplied from the gas source 26b into the main body 26a is heated by the heating source buried in the main body 26a and then blown toward the back surface Wb of the wafer W from a discharge port of the main body 26a. Thus, the wafer W is maintained at a predetermined temperature (for example, about 50 degrees C. to 80 degrees C.). This facilitates the removal process of the film F by the chemical liquid supplied to the wafer W.

The cup 27 has a function of receiving the chemical liquid and the rinse liquid supplied from the liquid supply parts 22 to 25 (the nozzles N1 to N8). The cup 27 is composed of a bottom wall 27a, an inner peripheral wall 27b, an outer peripheral wall 27c, a partition wall 27d and an inclined wall 27e.

The bottom wall 27a has an annular shape that surrounds the rotary holding part 21. The bottom wall 27a is positioned below the temperature adjustment part 26. The inner peripheral wall 27b has a stepped cylindrical shape that surrounds the temperature adjustment part 26. The inner peripheral wall 27b extends upward from an upper surface of the bottom wall 27a. The outer peripheral wall 27c has a cylindrical shape that surrounds the wafer W held by the rotary holding part 21 and the inner peripheral wall 27b. The outer peripheral wall 27c extends upward from an outer peripheral edge of the bottom wall 27a. An inner wall surface of an upper end portion of the outer peripheral wall 27c is inclined inward (toward the rotary holding part 21) as it goes upward.

The partition wall 27d has a cylindrical shape and extends upward from the upper surface of the bottom wall 27a. The height of the partition wall 27d is smaller than that of the inner peripheral wall 27b. The partition wall 27d is positioned between the inner peripheral wall 27b and the outer peripheral wall 27c and is located more outward than the peripheral portion We of the wafer W held by the rotary holding part 21. The partition wall 27d is provided with a plurality of through-holes 27f formed side by side along the circumferential direction thereof.

A liquid drain path (not shown) is connected to a region between the outer peripheral wall 27c and the partition wall 27d in the bottom wall 27a. From the liquid drain path, the chemical liquid and the rinse liquid supplied from the liquid supply parts 22 to 25 (the nozzles N1 to N8) are discharged to the outside. An exhaust flow path 50 is connected to a region between the inner peripheral wall 27b and the partition wall 27d in the bottom wall 27a. From the exhaust flow path 50, the down-flow formed by the blower is introduced into a space surrounded by the bottom wall 27a, the inner peripheral wall 27b, the partition wall 27d and the inclined wall 27e via the through-holes 27f of the partition wall 27d. The down-flow thus introduced is discharged from the exhaust flow path 50 to the outside. Details of the exhaust flow path 50 will be described later.

The inclined wall 27e connects an upper end portion of the inner peripheral wall 27b and an upper end portion of the partition wall 27d. Therefore, the inclined wall 27e is inclined downward as it goes outward. The nozzles N5 to N8 are attached to the inclined wall 27e. More specifically, the nozzles N5 and N6 are located in the inclined wall 27e at the lower left side of the rotary holding part 21 in FIG. 2. The nozzles N5 and N6 are used when the wafer W rotates in a forward rotational direction (second direction) which is clockwise as viewed from above. The nozzles N7 and N8 are positioned in the inclined wall 27e at the lower right side of the rotary holding part 21 in FIG. 3. The nozzles N7 and N8 are used when the wafer W rotates in a reverse rotational direction (first direction) which is counterclockwise as viewed from above.

[Configuration of Exhaust Flow Path]

Next, a configuration of the exhaust flow path 50 will be described with reference to FIGS. 3 to 6. The exhaust flow path 50 is a flow path through which the exhaust gas generated by the substrate process performed in the processing unit 16 is discharged to an external pipe. The exhaust flow path 50 includes an inner duct 51 (exhaust pipe), an outer duct 52, an inlet port 53, an intermediate flow path 54, a liquid supply part 60 (see FIG. 5) and an exhaust changer 70 (discharge destination setting part). The inlet port 53 is a portion to which the exhaust gas sent from the processing unit 16 is introduced. The intermediate flow path 54 connects the inner duct 51 and the inlet port 53.

The inner duct 51 is a pipe configured to be capable of selectively discharging the exhaust gas generated by the substrate process to either of an acidic chemical liquid pipe 150 (first pipe) and an alkaline chemical liquid pipe 160 (second pipe) which are used as the external pipes. The inner duct 51 is formed in a bottomed cylindrical shape. That is to say, in the inner duct 51, a surface continuous with the intermediate flow path 54 is opened in the axial direction and a surface (bottom surface) opposite the surface is continuous with a connection portion 72 (described later) of the exhaust changer 70. The inner duct 51 is configured to be rotatable about an axis by the exhaust changer 70. On the side surface of the inner duct 51, a first region 51x continuous with the acidic chemical liquid pipe 150 and a second region 51y continuous with the alkaline chemical liquid pipe 160 are formed in different regions in the axial direction. The acidic chemical liquid pipe 150 and the alkaline chemical liquid pipe 160 are the external pipes extending in a direction intersecting the side surface of the inner duct 51. The first region 51x refers to the entire region on the side surface of the inner duct 51 under rotation, which can be continuous with the acidic chemical liquid pipe 150. Specifically, the first region 51x refers to the entire region (the entire region in the circumferential direction) in the side surface of the inner duct 51, which has the same axial position as the region of the acidic chemical liquid pipe 150. Likewise, the second region 51y refers to the entire region on the side surface of the inner duct 51 under rotation, which can be continuous with the alkaline chemical liquid pipe 160. Specifically, the second region 51y refers to the entire region (the entire region in the circumferential direction) on the side surface of the inner duct 51, which has the same axial position as the region of the alkaline chemical liquid pipe 160.

Figure 3:
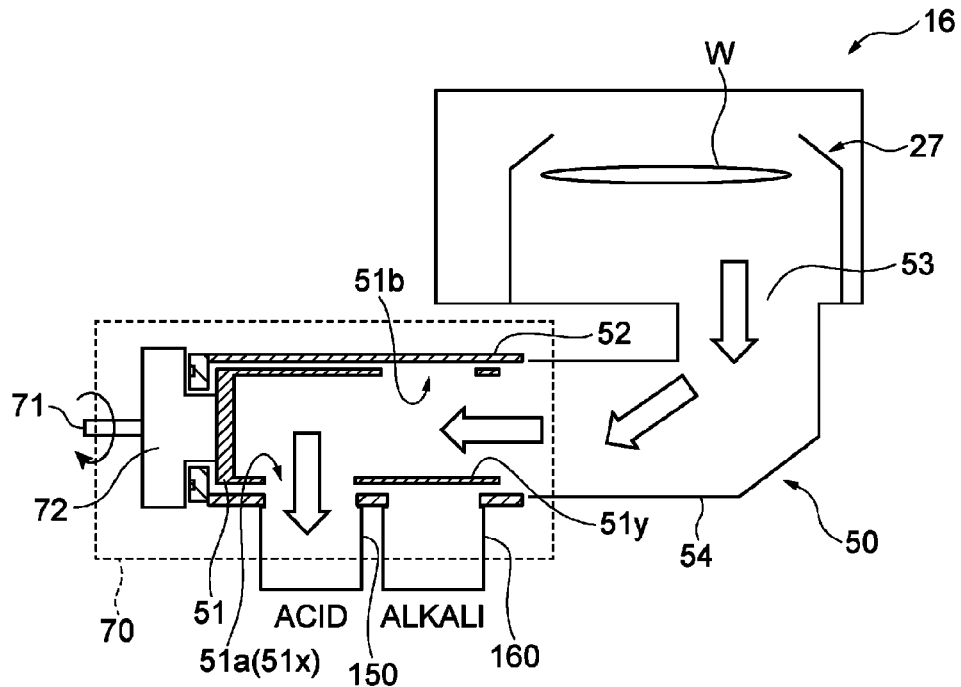
FIG. 3 illustrates a view showing a schematic configuration of an exhaust pipe.
Figure 4A:
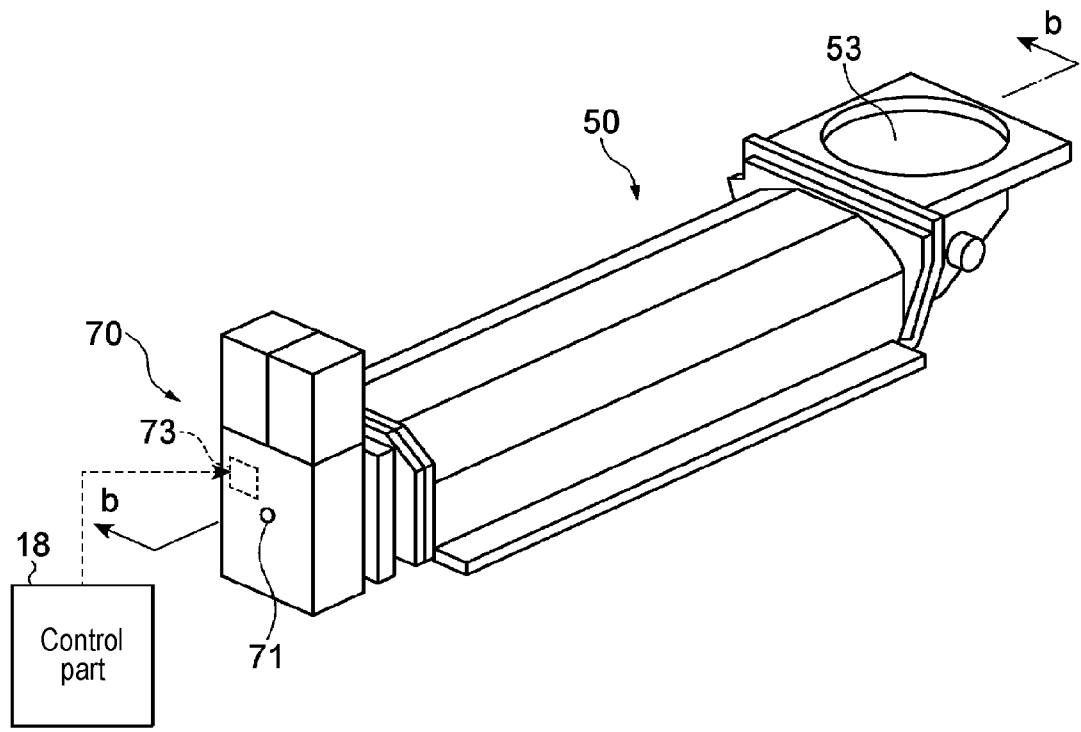
FIG. 4A illustrates a perspective view showing the detailed configuration of the exhaust pipe.
Figure 4B:
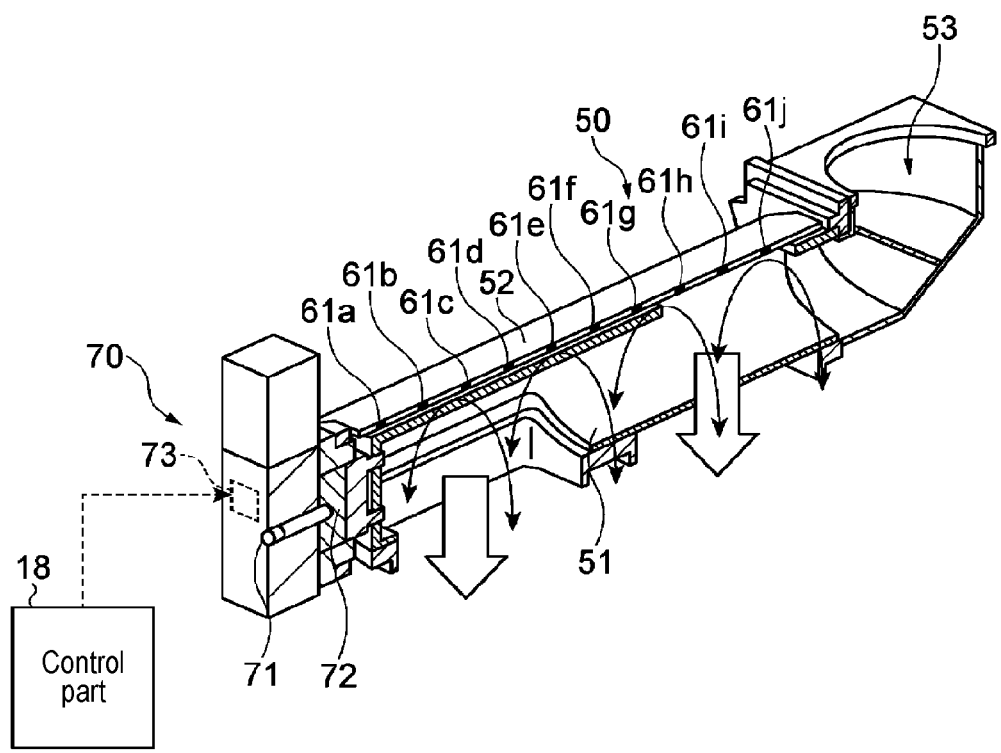
FIG. 4B illustrates a sectional perspective view taken along line b-b in FIG. 4A.
Figure 6:
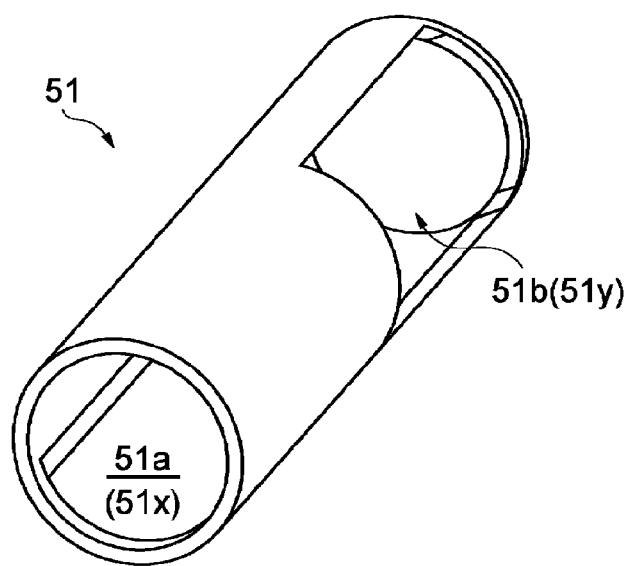
FIG. 6 illustrates a perspective view of an inner duct.

In the inner duct 51, a first penetration region 51a formed to penetrate the side surface of the inner duct 51 is formed in a portion of the first region 51x such that the interior of the inner duct 51 and the acidic chemical liquid pipe 150 communicate with each other. Furthermore, in the inner duct 51, a second penetration region 51b formed to penetrate the side surface of the inner duct 51 is formed in a portion of the second region 51y such that the interior of the inner duct 51 and the alkaline chemical liquid pipe 160 communicate with each other. As shown in FIGS. 3 and 6, the first penetration region 51a and the second penetration region 51b are formed in different regions in the circumferential direction of the inner duct 51. That is to say, the first penetration region 51a and the second penetration region 51b are formed in different regions in the axial direction and the circumferential direction of the inner duct 51. Thus, in the inner duct 51, only one of the first penetration region 51a and the second penetration region 51b communicates with the external pipe (the acidic chemical liquid pipe 150 in the case of the first penetration region 51a or the alkaline chemical liquid pipe 160 in the case of the second penetration region 51b) such that the exhaust gas may be discharged to either of the acidic chemical liquid pipe 150 and the alkaline chemical liquid pipe 160.

The outer duct 52 is a pipe provided so as to cover the outer circumference of the inner duct 51. The outer duct 52 has openings in the side surface thereof so as to be continuous with the acidic chemical liquid pipe 150 and the alkaline chemical liquid pipe 16 (see FIG. 3). As shown in FIG. 3, an inner surface of the outer duct 52 is not in contact with an outer surface of the inner duct 51. The outer duct 52 covers an outer circumference of the inner duct 51 in a state in which the outer duct 52 is separated by a predetermined distance from the outer circumference of the inner duct 51. As shown in FIG. 5, nozzles 61a to 61j of the liquid supply part 60 are provided on an upper side surface of the outer duct 52.

The liquid supply part 60 is configured to supply a liquid for cleaning into the inner duct 51. As shown in FIG. 5, the liquid supply part 60 includes a chemical liquid source 62 (first supply part), a rinse liquid source 63 (second supply part) and the nozzles 61a to 61j.

The chemical liquid source 62 operates based on a control signal transmitted from the control part 18 and supplies a chemical liquid for dissolving the deposits adhering to the inner duct 51 and the like to the nozzles 61a, 61c, 61d, 61f, 61h and 61j. The deposits adhering to the inner duct 51 and the like are deposits adhering to an outer circumferential surface of the inner duct 51, an inner circumferential surface of the inner duct 51, the connection portion 72 of the exhaust changer 70 and the like, and are, for example, deposits including crystals (salts) generated by the reaction of the acidic chemical liquid and the alkaline chemical liquid used during the substrate process. The chemical liquid supplied from the chemical liquid source 62 is, for example, DHF (diluted hydrofluoric acid). In some embodiments, the chemical liquid source 62 may include, for example, a chemical liquid tank, a pump for forcibly feeding the chemical liquid from the chemical liquid tank, and a valve for controlling the ON/OFF of the flow of the chemical liquid, which are not shown herein.

The rinse liquid source 63 operates based on a control signal transmitted from the control part 18 and supplies the rinse liquid for washing away the chemical liquid and the dissolved component of the deposits to the nozzles 61b, 61e, 61g and 61i. The rinse liquid supplied from the rinse liquid source 63 may be pure water. In some embodiments, the rinse liquid source 63 may include a rinse liquid tank, a pump for forcibly feeding the rinse liquid from the rinse liquid tank, and a valve for controlling the ON/OFF of the flow of the rinse liquid, which are not shown herein.

The nozzles 61a to 61j are located on the outer duct 52 (specifically, on the upper portion of the outer duct 52) to discharge the liquid toward the inner duct 51. The nozzles 61a, 61c, 61d, 61f, 61h and 61j discharge the chemical liquid supplied from the chemical liquid source 62 to the inner duct 51. The nozzles 61b, 61e, 61g, and 61i discharge the rinse liquid supplied from the rinse liquid source 63 to the inner duct 51 after the chemical liquid is discharged by, for example, the nozzles 61a, 61c, 61d, 61f, 61h and 61j. As shown in FIG. 5, the nozzles 61a to 61j are arranged in the order of the nozzle 61a, the nozzle 61b, the nozzle 61c, the nozzle 61d, the nozzle 61e, the nozzle 61f, the nozzle 61g, the nozzle 61h, the nozzle 61i and the nozzle 61j from an inner side of the outer duct 52 toward an inlet side (side closer to the inlet port 53). In the example shown in FIG. 5, the nozzles (nozzles 61a, 61c, 61d, 61f, 61h and 61j) for discharging the chemical liquid supplied from the chemical liquid source 62 to the inner duct 51, and the nozzles (nozzles 61b, 61e, 61g, and 61i) for discharging the rinse liquid supplied from the rinse liquid source 63 to the inner duct 51 are alternately located in an axial direction of the outer duct 52. However, the arrangement of the nozzles is not limited thereto.

The exhaust changer 70 rotates the inner duct 51 to set the discharge destination of the exhaust gas to either the acidic chemical liquid pipe 150 or the alkaline chemical liquid pipe 160 (see FIG. 3). As shown in FIG. 5, the exhaust changer 70 includes a rotating shaft part 71, a connection part 72 and a rotary driving part 73.

The connection part 72 is connected to the inner duct 51. The rotating shaft part 71 is connected to the connection part 72 and rotated by force applied from the rotary driving part 73. The rotary driving part 73 is an actuator that utilizes, for example, an electric motor or the like as a power source. The rotary driving part 73 operates based on an operation signal transmitted from the control part 18 and rotates the rotating shaft part 71. The rotational force of the rotating shaft part 71 is transmitted to the inner duct 51 via the connection part 72. That is to say, the inner duct 51 rotates together with the rotating shaft part 71 and the connection part 72.

[Configuration of Control Part]

Figure 7:
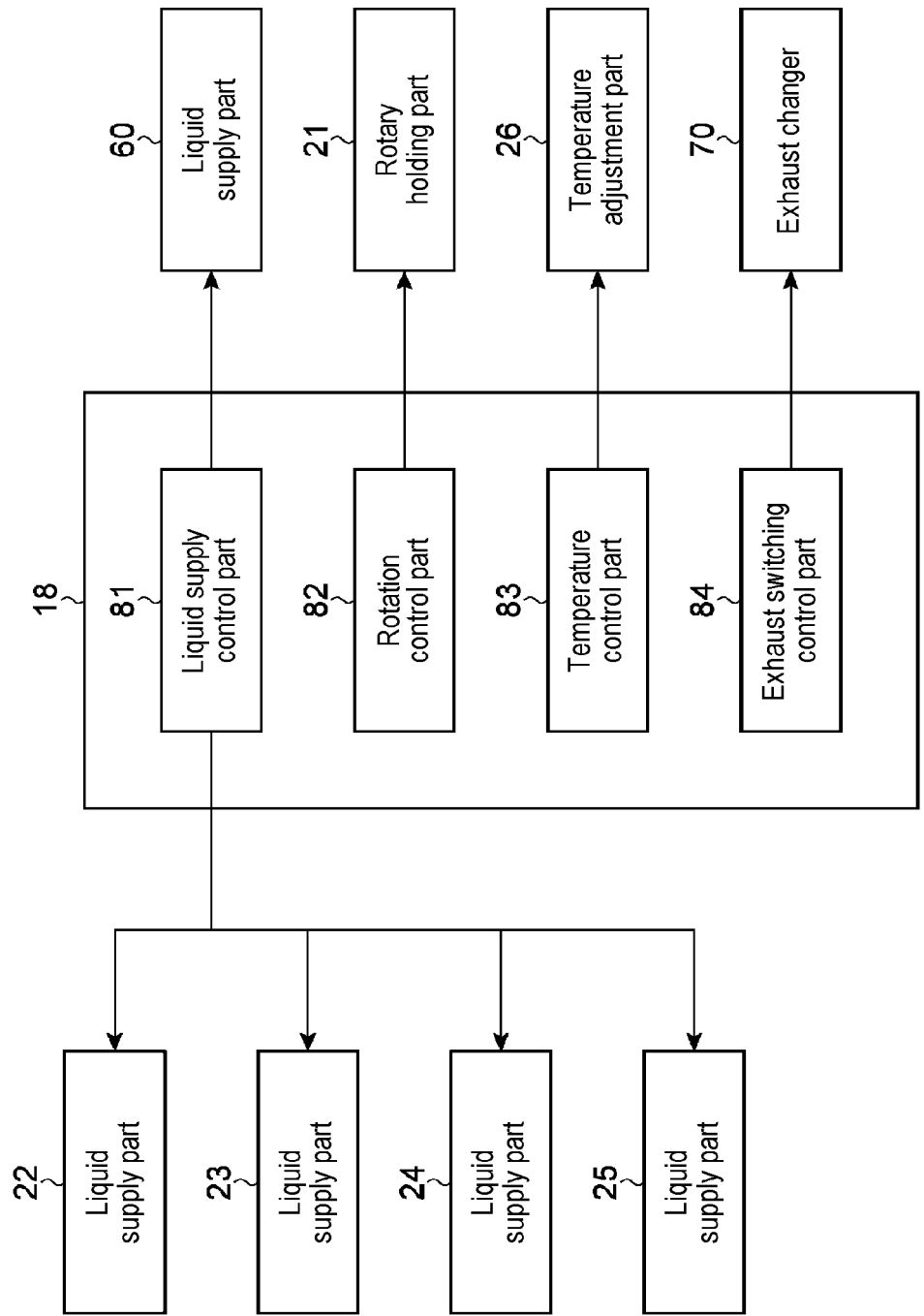
FIG. 7 illustrates a view showing functional blocks of a control part.

As shown in FIG. 7, the control part 18 includes, as functional modules, a liquid supply control part 81, a rotation control part 82, a temperature control part 83 and an exhaust switching control part 84.

Some processes (the substrate process) performed by the substrate processing apparatus 10 includes a main wafer process aimed at removing the film F of the wafer W and a cup cleaning process aimed at cleaning the cup 27 and the exhaust flow path 50, which will be separately described. The cup cleaning process is performed, for example, in the state in which the wafer W is held by the rotary holding part 21 after the main wafer process is performed. The cup cleaning process is, for example, a process of cleaning the cup 27 by supplying the rinse liquid to the back surface Wb of the wafer W under rotation and allowing the rinse liquid to reach the cup 27 after it is shaken off from the vicinity of the outer peripheral edge of the wafer W by virtue of a centrifugal force.

The liquid supply control part 81 controls the liquid supply parts 22, 23, 24, 25 and 60 so as to supply the liquids. The liquid supply control part 81 controls the liquid supply parts 22, 23, 24, 25 and 60 in the main wafer process. In the main wafer process, the liquid supply part to be controlled varies depending on the rotational direction of the wafer W. That is to say, when the wafer W rotates in the forward rotational direction, the liquid supply control part 81 controls the liquid supply part 22 or the liquid supply part 23 such that the alkaline chemical liquid is supplied from the respective liquid supply part for supplying the alkaline chemical liquid among the liquid supply parts 22 and 23, and controls the liquid supply part 24 such that the liquids are supplied from the nozzles N5 and N6. When the wafer W rotates in the reverse rotational direction, the liquid supply control part 81 controls the liquid supply part 22 or the liquid supply part 23 such that the acidic chemical liquid is supplied from the respective liquid supply part for supplying the acidic chemical liquid among the liquid supply parts 22 and 23, and controls the liquid supply part 25 such that the liquids are supplied from the nozzles N7 and N8. In the cup cleaning process, the liquid supply control part 81 controls the liquid supply parts 24, 25 and 60. Also in the cup cleaning process, the liquid supply part to be controlled varies depending on the rotational direction of the wafer W. That is to say, when the wafer W rotates in the forward rotational direction, the liquid supply control part 81 controls the rinse liquid source 24b such that the liquid is supplied from the nozzle N6. In addition, when the wafer W rotates in the reverse rotational direction, the liquid supply control part 81 controls the rinse liquid source 25b such that the liquid is supplied from the nozzle N8.

In the cup cleaning process, the liquid supply control part 81 controls the liquid supply part 60 such that the liquid is supplied from the nozzles 61a to 61j to the inner duct 51 regardless of the rotational direction of the wafer W. The liquid supply control part 81 controls the liquid supply part 60 such that the liquid is supplied to the inner duct 51 rotating under the control of the exhaust switching control part 84. More specifically, the liquid supply control part 81 controls the chemical liquid source 62 such that the DHF is supplied to the rotating inner duct 51, and then controls the rinse liquid source 63 such that the rinse liquid is supplied to the rotating inner duct 51.

The rotation control part 82 controls the rotary driver 21*b* such that the holder 21*a* rotates about the rotation axis Ax. The rotation control part 82 switches the rotational direction of the wafer W held by the holder 21*a* between the forward rotational direction and the reverse rotational direction in either the main wafer process or the cup cleaning process. For example, the rotation control part 82 controls the rotary driver 21*b* such that the wafer W rotates in the forward rotational direction for a predetermined period of time after the wafer W rotates in the reverse rotational direction for a predetermined period of time. The temperature control part 83 controls the temperature adjustment part 26 such that the wafer W is heated.

The exhaust switching control part 84 controls the exhaust changer 70 to rotate the inner duct 51 and switches the discharge destination of the exhaust gas (the acidic chemical liquid pipe 150 or the alkaline chemical liquid pipe 160). The exhaust switching control part 84 switches the discharge destination according to the rotational direction of the wafer W. When the wafer W rotates in the forward rotational direction, the exhaust switching control part 84 controls the exhaust changer 70 such that the discharge destination in the inner duct 51 becomes the alkaline chemical liquid pipe 160. Furthermore, when the wafer W rotates in the reverse rotational direction, the exhaust switching control part 84 controls the exhaust changer 70 such that the discharge destination in the inner duct 51 becomes the acidic chemical liquid pipe 150. Moreover, in the cup cleaning process, the exhaust switching control part 84 controls the exhaust changer 70 such that the inner duct 51 rotates during the rotation of the wafer W to switch the discharge destination. That is to say, when the wafer W rotates in the forward rotational direction, the exhaust switching control part 84 controls the exhaust changer 70 such that the inner duct 51 is rotated to switch the discharge destination of the inner duct 51 from the alkaline chemical liquid pipe 160 to the acidic chemical liquid pipe 150. When the wafer W rotates in the reverse rotational direction, the exhaust switching control part 84 controls the exhaust changer 70 such that the inner duct 51 is rotated to switch the discharge destination of the inner duct 51 from the acidic chemical liquid pipe 150 to the alkaline chemical liquid pipe 160. The exhaust switching control part 84 controls the exhaust changer 70 such that the inner duct 51 is rotated in a direction to return to the initial discharge destination (the discharge destination corresponding to the rotational direction of the wafer W) after a predetermined period of time from the switching of the discharge destination during rotation.

[Wafer Processing Method]

Figure 8:
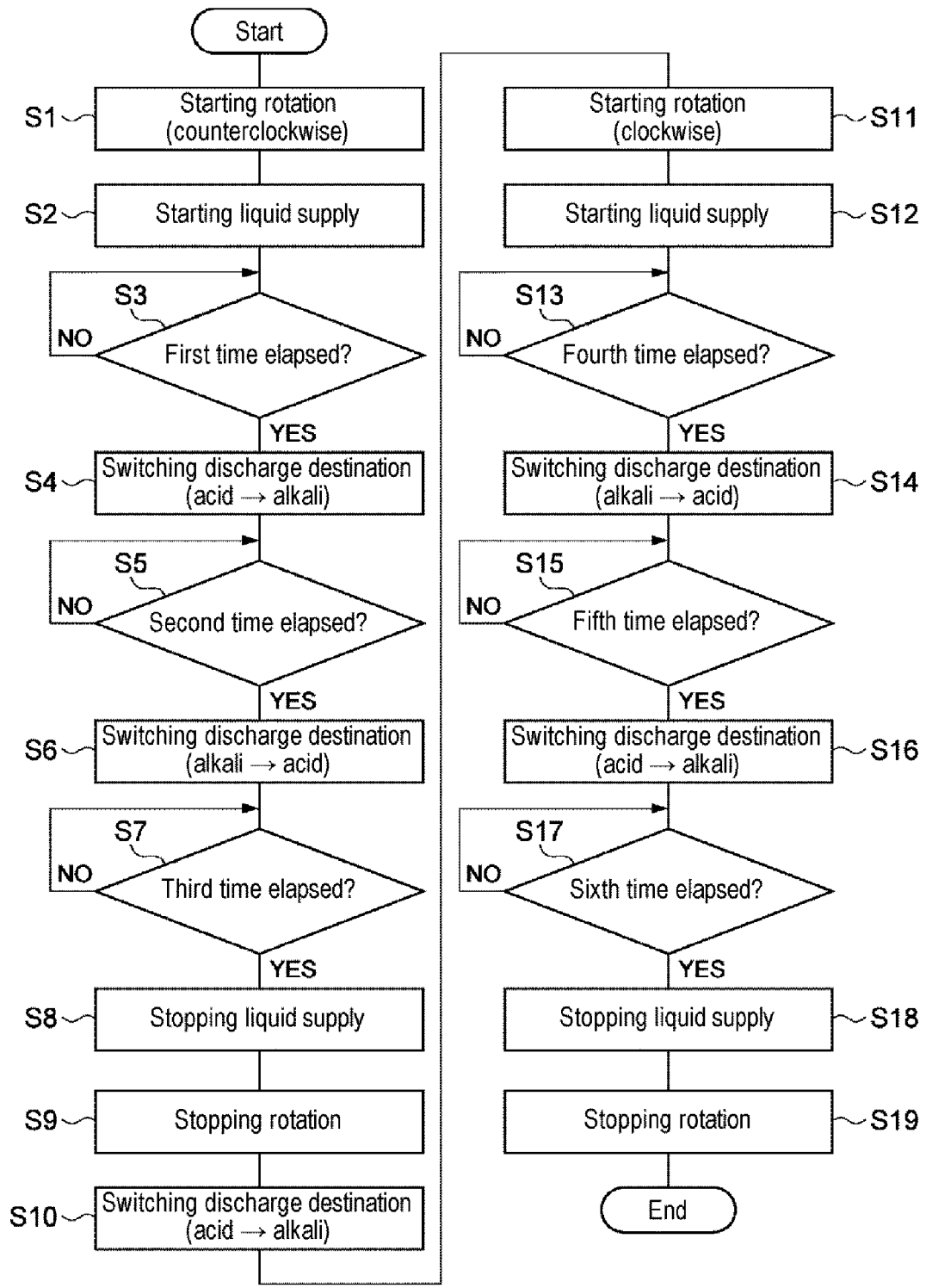
FIG. 8 illustrates a flowchart for explaining a procedure of a cup cleaning process.

Next, a method of processing the wafer W by the processing unit 16 will be described with reference to FIG. 8. A procedure of the cup cleaning process will now be described with reference to FIG. 8. As described above, the cup cleaning process of the present embodiment is performed after the main wafer process is carried out. Therefore, at the start of the cup cleaning process, the wafer W is supported in place by the rotary holding part 21.

In the cup cleaning process, first, the control part 18 controls the rotary holding part 21 to rotate the wafer W in the reverse rotational direction (counterclockwise) at a predetermined number of revolutions (Step S1). The predetermined number of revolutions may fall within a range of, for example, several tens rpm (for example, about 10 rpm) to 3,000 rpm, specifically about 1,000 rpm. When the rotation of the wafer W begins, the discharge destination of the exhaust gas in the inner duct 51 is the acidic chemical liquid pipe 150. In this state, the control part 18 controls the liquid supply parts 25 and 60 to begin the supply of the liquids by the liquid supply parts 25 and 60 (Step S2). That is to say, the control part 18 controls the rinse liquid source 25*b* to supply the rinse liquid from the nozzle N8 toward the back surface Wb of the wafer W. In addition, the control part 18 controls the rinse liquid source 63 to supply the rinse liquid from the nozzles 61*b*, 61*e*, 61*g* and 61*i* to the inner duct 51.

Subsequently, the control part 18 determines whether or not a first predetermined period of time has elapsed from the start of the rotation (rotation in the reverse rotational direction) of the wafer W (Step S3). The first predetermined period of time may be, about 30 seconds to 50 seconds. The process keeps repeating Step S3 until the first predetermined period of time is elapsed.

If it is determined in Step S3 that the first predetermined period of time has elapsed, the control part 18 switches the discharge destination of the exhaust gas in the inner duct 51 from the acidic chemical liquid pipe 150 to the alkaline chemical liquid pipe 160 (Step S4). That is to say, the control part 18 controls the exhaust changer 70 such that the inner duct 51 is rotated (the discharge destination of the exhaust gas in the inner duct 51 is switched from the acidic chemical liquid pipe 150 to the alkaline chemical liquid pipe 160). At a time at which the inner duct 51 rotates, the control part 18 may control the liquid supply part 60 such that the liquid supplied to the inner duct 51 becomes DHF for a predetermined period of time. In conformity with the rotation start timing of the inner duct 51, the control part 18 controls the rinse liquid source 63 to stop the supply of the rinse liquid and controls the chemical liquid source 62 to start the supply of DHF from the nozzles 61*a*, 61*c*, 61*d*, 61*f*, 61*h* and 61*j*. In this case, the control part 18 controls the liquid supply part 60 such that the liquid to be supplied to the inner duct 51 is switched to the rinse liquid after a predetermined period of time (for example, 15 seconds). Therefore, it is possible to realize a configuration in which the rinse liquid is supplied to the inner duct 51 after the DHF is supplied to the rotating inner duct 51.

Subsequently, the control part 18 determines whether or not a second predetermined period of time has elapsed since performing the discharge destination switching process in Step S4 (Step S5). The second predetermined period of time may be about 20 seconds to 40 seconds. The process keeps repeating Step S5 until the second predetermined period of time is elapsed.

If it is determined in Step S5 that the second predetermined period of time has elapsed, the control part 18 controls the exhaust changer 70 such that the discharge destination of the exhaust gas in the inner duct 51 is switched to the acidic chemical liquid pipe 150 which is the initial discharge destination (such that the discharge destination is switched from the alkaline chemical liquid pipe 160 to the acidic chemical liquid pipe 150) (Step S6).

Subsequently, the control part 18 determines whether or not a third predetermined period of time has elapsed since the start of the rotation (rotation in the reverse rotational direction) of the wafer W (Step S7). The third predetermined period of time may be about 100 seconds to 120 seconds. The process keeps repeating Step S7 until the third predetermined period of time is elapsed.

If it is determined in Step S7 that the third predetermined period of time has elapsed, the control part 18 controls the liquid supply parts 25 and 60 to stop the supply of the liquid from the liquid supply parts 25 and 60 (Step S8). Then, the control part 18 controls the rotary holding part 21 to stop the rotation of the wafer W (Step S9).

Subsequently, the control part 18 controls the exhaust changer 70 such that the discharge destination of the exhaust gas in the inner duct 51 is switched from the acidic chemical liquid pipe 150 to the alkaline chemical liquid pipe 160 (Step S10). In this state, the control part 18 controls the rotary holding part 21 to rotate the wafer W in the forward rotational direction (clockwise) at a predetermined number of revolutions (Step S11). The predetermined number of revolutions may fall within a range of, for example, several tens rpm (for example, about 10 rpm) to 3,000 rpm, specifically about 1,000 rpm. The control part 18 controls the liquid supply parts 24 and 60 to start the supply of the liquid from the liquid supply parts 24 and 60 (Step S12). That is to say, the control part 18 controls the rinse liquid source 24b to supply the rinse liquid from the nozzle N6 toward the back surface Wb of the wafer W. In addition, the control part 18 controls the rinse liquid source 63 to supply the rinse liquid from the nozzles 61b, 61e, 61g and 61i to the inner duct 51.

Subsequently, the control part 18 determines whether or not a fourth predetermined period of time has elapsed since the start of the rotation (rotation in the forward rotational direction) of the wafer W (Step S13). The fourth predetermined period of time may be about 30 seconds to 50 seconds. The process keeps repeating Step S13 until the fourth predetermined period of time is elapsed.

If it is determined in Step S13 that the fourth predetermined period of time has elapsed, the control part 18 switches the discharge destination of the exhaust gas in the inner duct 51 from the alkaline chemical liquid pipe 160 to the acidic chemical liquid pipe 150 (Step S14). That is to say, the control part 18 controls the exhaust changer 70 such that the inner duct 51 is rotated (the discharge destination of the exhaust gas in the inner duct 51 is switched from the alkaline chemical liquid pipe 160 to the acidic chemical liquid pipe 150). At a time when the inner duct 51 rotates, the control part 18 may control the liquid supply part 60 such that the liquid supplied to the inner duct 51 becomes DHF for a predetermined period of time. That is to say, in conformity with the rotation start timing of the inner duct 51, the control part 18 may control the rinse liquid source 63 to stop the supply of the rinse liquid and control the chemical liquid source 62 to start the supply of DHF from the nozzles 61a, 61c, 61d, 61f, 61h and 61j. In this case, the control part 18 controls the liquid supply part 60 such that the liquid to be supplied to the inner duct 51 is switched to the rinse liquid after a predetermined period of time (for example, 15 seconds). Therefore, it is possible to realize a configuration in which the rinse liquid is supplied to the rotating inner duct 51 after the DHF is supplied to the rotating inner duct 51.

Subsequently, the control part 18 determines whether or not a fifth predetermined period of time has elapsed since performing the discharge destination switching process in Step S14 (Step S15). The fifth predetermined period of time may be about 20 seconds to 40 seconds. The process keeps repeating Step S15 until the fifth predetermined period of time is elapsed.

If it is determined in Step S15 that the fifth predetermined period of time has elapsed, the control part 18 controls the exhaust changer 70 such that the discharge destination of the exhaust gas in the inner duct 51 is switched to the alkaline chemical liquid pipe 160 which is the initial discharge destination (such that the discharge destination is switched from the acidic chemical liquid pipe 150 to the alkaline chemical liquid pipe 160) (Step S16).

Subsequently, the control part 18 determines whether or not a sixth predetermined period of time has elapsed since the start of the rotation (rotation in the forward rotational direction) of the wafer W (Step S17). The sixth predetermined period of time may be, for example, about 100 seconds to 120 seconds. The process keeps repeating Step S17 until the sixth predetermined period of time is elapsed.

If it is determined in Step S17 that the sixth predetermined period of time has elapsed, the control part 18 controls the liquid supply parts 24 and 60 to stop the supply of the liquid from the liquid supply parts 24 and 60 (Step S18). Then, the control part 18 controls the rotary holding part 21 to stop the rotation of the wafer W (Step S19).

[Action]

In general, the substrate processing apparatus is provided with an exhaust pipe for discharging an exhaust gas generated by the liquid treatment to the outside. Such an exhaust pipe discharges an exhaust gas to an external pipe corresponding to, for example, the property (acidic or alkaline property) of a chemical liquid supplied to a wafer. The exhaust pipe is configured such that the external pipe (discharge destination of the exhaust gas) communicating with the exhaust pipe is switched by, for example, rotating the exhaust pipe. In the meantime, deposits (for example, crystals generated by reaction of an acidic chemical liquid with an alkaline chemical liquid) associated with the discharge of the exhaust gas may sometimes adhere to the side surface (outer circumferential surface and inner circumferential surface) of the exhaust pipe. Conventionally, it is difficult to effectively clean such deposits. For example, there is a case where a process is periodically performed only for cleaning deposits. This inhibits an efficient substrate process.

To address such a problem, the substrate processing apparatus 10 according to the present embodiment includes the inner duct 51 configured to be capable of selectively discharging the exhaust gas generated by the substrate process to either the acidic chemical liquid pipe 150 or the alkaline chemical liquid pipe 160, which is an external pipe, the liquid supply part 60 configured to supply the liquid for cleaning from outside to the inner duct 51, the exhaust changer 70 configured to rotate the inner duct 51 to thereby designate (switch) the discharge destination of the exhaust gas to either the acidic chemical liquid pipe 150 or the alkaline chemical liquid pipe 160, and the control device 4 provided with the control part 18. The control part 18 is configured to control the exhaust changer 70 so as to rotate the inner duct 51 and to control the liquid supply part 60 so as to supply the liquid to the rotating inner duct 51.

In the substrate processing apparatus 10 configured as above, the cleaning liquid (for example, DHF) is supplied to the rotating inner duct 51. In this manner, by supplying the liquid to the inner duct 51 while rotating the inner duct 51, it is possible to effectively supply the liquid to the entire circumference of the side surface of the inner duct 51. Since the first penetration region 51a and the second penetration region 51b defined to penetrate the side surface of the inner duct 51 are formed in the inner duct 51, the cleaning liquid is supplied not only to the outer circumferential surface of the inner duct 51 but also to the inner circumferential surface of the inner duct 51. As a result, the entire circumference of the outer and the inner circumferential surface of the inner duct 51 is cleaned by the cleaning liquid. This makes it possible to effectively clean the deposits (crystals) attached to the outer circumferential surface and the inner circumferential surface of the inner duct 51.

The substrate processing apparatus 10 further includes the rotary holding part 21 configured to rotate the wafer W while holding the wafer W. As described in Steps S1 to S4 of FIG. 8, the control part 18 controls the exhaust changer 70 so as to rotate the inner duct 51 during the rotation of the wafer W. As described above, during the cup cleaning process in which the wafer W rotates, the inner duct 51 is rotated and the liquid is supplied to the rotating inner duct 51, whereby the deposits of the inner duct 51 can be removed during the cup cleaning process. This eliminates a need to provide a separate cleaning period only to remove the deposits of the inner duct 51, thus realizing a more efficient substrate process. As compared with the main wafer process in which the acidic or alkaline chemical liquid is supplied to the front surface Wa of the wafer W, in the cup cleaning process, the amount of the exhaust gas relating to the acidic or alkaline chemical liquid flowing in the inner duct 51 is small. For this reason, even when processing is performed to rotate the inner duct 51 during the rotation of the wafer W to switch the discharge destination (the acidic chemical liquid pipe 150 or the alkaline chemical liquid pipe 160) in the inner duct 51, the amount of the exhaust gas with different properties (acidic or alkaline) flowing through the acidic chemical liquid pipe 150 or the alkaline chemical liquid pipe 160 is small, which does not matter.

Furthermore, the liquid supply part 60 includes the chemical liquid source 62 for supplying DHF and the rinse liquid source 63 for supplying the rinse liquid. The control part 18 controls the chemical liquid source 62 such that the DHF is supplied to the rotating inner duct 51, and then controls the rinse liquid source 63 such that the rinse liquid is supplied to the rotating inner duct 51. As a result, after the deposits adhering to the inner duct 51 are dissolved by the DHF, the dissolved component of the deposits can be washed out by the rinse liquid (for example, pure water). This makes it possible to more effectively clean the deposits.

The inner duct 51 is formed in a cylindrical shape and has, in its side surface, the first region 51x continuous with the acidic chemical liquid pipe 150 and the second region 51y continuous with the alkaline chemical liquid pipe 160, which are defined in different regions in the axial direction. In a portion of the first region 51x, the first penetration region 51a defined to penetrate the side surface is formed such that the interior of the inner duct 51 and the acidic chemical liquid pipe 150 communicate with each other. In a portion of the second region 51y, the second penetration region 51b defined to penetrate the side surface is formed such that the interior of the inner duct 51 and the alkaline chemical liquid pipe 160 communicate with each other. The first penetration region 51a and the second penetration region 51b are formed in different regions in the circumferential direction of the inner duct 51. That is to say, the first penetration region 51a and the second penetration region 51b are formed in different regions in the axial direction and the circumferential direction of the inner duct 51. As a result, it is possible to realize a configuration in which only one of the first penetration region 51a and the second penetration region 51b of the inner duct 51 communicate with the external pipe (the acidic chemical liquid pipe 150 in the case of the first penetration region 51a or the alkaline chemical liquid pipe 160 in the case of the second penetration region 51b). Thus, with a simplified configuration, it is possible to discharge the exhaust gas only to either the acidic chemical liquid pipe 150 or the alkaline chemical liquid pipe 160.

Modification

Although the embodiments according to the present disclosure have been described above in detail, various modifications may be added to the above-described embodiment within the scope of the present disclosure. For example, while there has been described the example in which the liquid is supplied to the inner duct 51 while rotating the inner duct 51 during the cup cleaning process to remove the deposits adhering to the inner duct 51, the process for removing the deposits adhering to the inner duct 51 may be executed during the main wafer process. However, as described above, the discharge destination of the exhaust gas (the acidic chemical liquid pipe 150 or the alkaline chemical liquid pipe 160) is changed by rotating the inner duct 51. Therefore, it is impossible to unconditionally rotate the inner duct 51 in the main wafer process in which the acidic or alkaline chemical liquid is supplied to the front surface Wa of the wafer W. In this respect, in the main wafer process, when the rotational direction of the wafer W is changed, there is a time zone during which the supply of the liquid to the wafer W is temporarily stopped. In such a time zone, even if the process of rotating the inner duct 51 and supplying the liquid to the rotating inner duct 51 (the process of removing the deposits on the inner duct 51) is performed, there is no problem in the substrate process. Therefore, only during a time interval in which the supply of the liquid to the wafer W is temporarily stopped, the process of removing the deposits on the inner duct 51 may be performed even during the main wafer process. That is to say, in the main wafer process, the control part 18 may control the exhaust changer 70 so as to rotate the inner duct 51 at the supply stop timing of the liquid to the wafer W when the rotational direction of the wafer W is switched from the first direction (for example, the reverse rotational direction) to the second direction (for example, the forward rotational direction).

Figure 9:
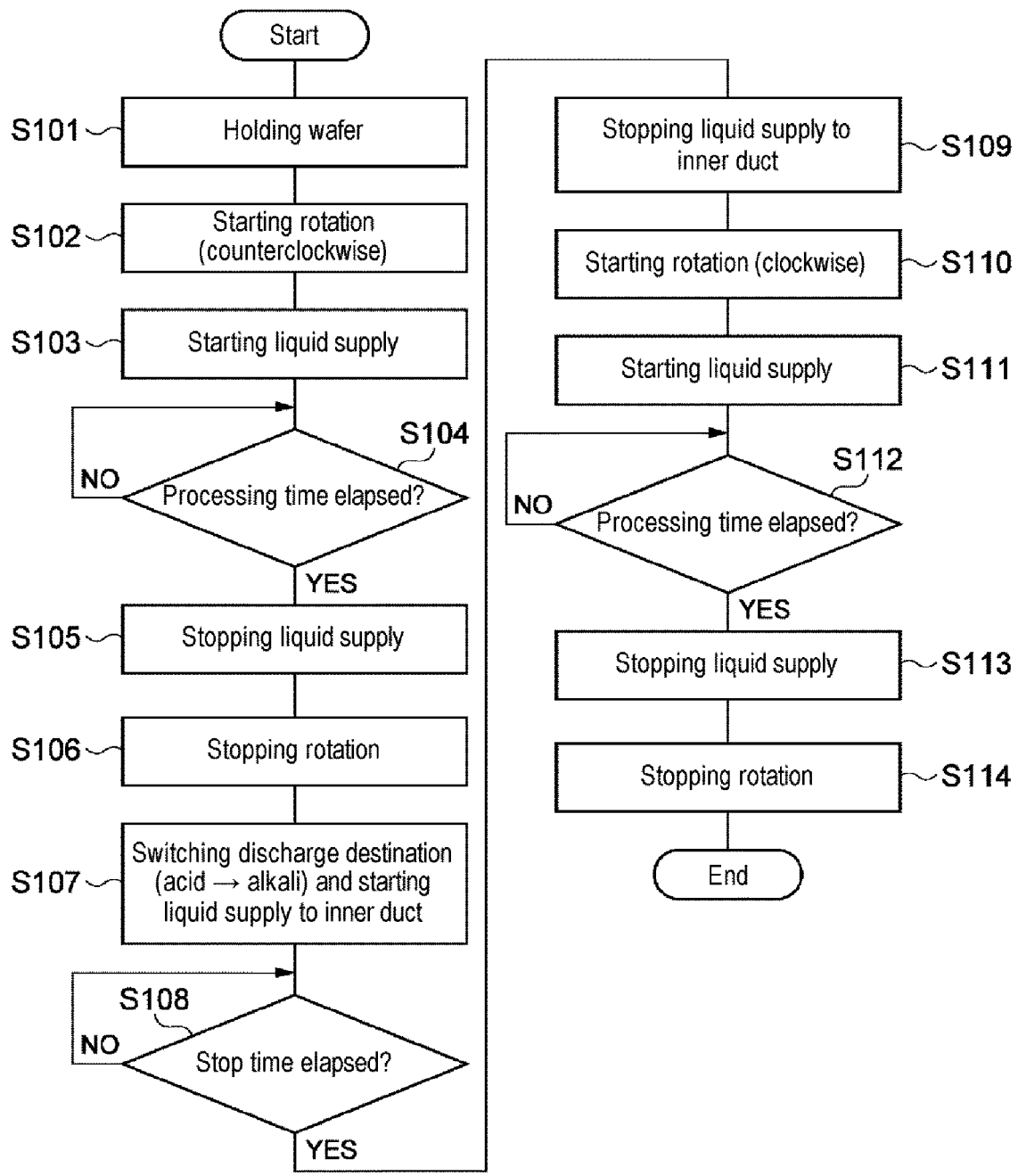
FIG. 9 illustrates a flowchart for explaining a procedure of a main wafer process.

FIG. 9 is a flowchart illustrating a procedure of a main wafer process including a process of removing deposits on the inner duct 51. In the following description on the main wafer process, the liquid supply part 23 supplies an acidic chemical liquid, and the liquid supply part 22 supplies an alkaline chemical liquid. In the following description, descriptions consistent with the descriptions of the process in FIG. 8 are omitted in some cases. In the main wafer process, first, the control part 18 controls the rotary holding part 21 to hold the wafer W by the rotary holding part 21 (Step S101).

Subsequently, the control part 18 controls the rotary holding part 21 to rotate the wafer W in the reverse rotational direction (counterclockwise) at a predetermined number of revolutions (Step S102). When the rotation of the wafer W begins, the discharge destination of the exhaust gas in the inner duct 51 is the acidic chemical liquid pipe 150. In this state, the control part 18 controls the liquid supply parts 23 and 25 to start the supply of the liquid from the liquid supply parts 23 and 25 (Step S103).

Subsequently, the control part 18 determines whether or not a predetermined period of time has elapsed since the start of the rotation (rotation in the reverse rotational direction) of the wafer W (Step S104). The process keeps repeating Step S104 until the predetermined period of time is elapsed.

If it is determined in Step S104 that the predetermined period of time has elapsed, the control part 18 controls the liquid supply parts 23 and 25 to stop the supply of the liquid from the liquid supply parts 23 and 25 (Step S105). Then, the control part 18 controls the rotary holding part 21 to stop the rotation of the wafer W (Step S106).

In the state in which the rotation of the wafer W is stopped and the liquid is not supplied to the wafer W, the control part 18 switches the discharge destination of the exhaust gas in the inner duct 51 from the acidic chemical liquid pipe 150 to the alkaline chemical liquid pipe 160, and controls the liquid supply part 60 to start the supply of the liquid to the inner duct 51 by the liquid supply part 60 (Step S107).

Subsequently, the control part 18 determines whether or not a predetermined wafer rotation stop period has elapsed (Step S108). The process keeps repeating Step S108 until the predetermined wafer rotation stop period of time is elapsed.

If it is determined in Step S108 that the predetermined wafer rotation stop period of time has elapsed, the control part 18 controls the liquid supply part 60 to stop the supply of the liquid to the inner duct 51 by the liquid supply part 60. Then, the control part 18 controls the rotary holding part 21 to rotate the wafer W in the forward rotational direction (clockwise) at a predetermined number of revolutions (Step S110). Furthermore, the control part 18 controls the liquid supply parts 22 and 24 to start the supply of the liquid by the liquid supply parts 22 and 24 (Step S111).

Subsequently, the control part 18 determines whether or not a predetermined period of time has elapsed since the start of the rotation (rotation in the forward rotational direction) of the wafer W (Step S112). The process keeps repeating Step S112 until the predetermined period of time is elapsed.

If it is determined in Step S112 that the predetermined period of time has elapsed, the control part 18 controls the liquid supply parts 22 and 24 to stop the supply of the liquid by the liquid supply parts 22 and 24 (Step S113). Then, the control part 18 controls the rotary holding part 21 to stop the rotation of the wafer W (Step S114). The above description is on the procedure of the main wafer process including a process of removing the deposits on the inner duct 51.

In addition, although the liquid supply part 60 has been described as supplying the DHF and the rinse liquid as liquids, the present disclosure is not limited thereto. As an example, the liquid supply part 60 may supply only one of the DHF and the rinse liquid.

According to the present disclosure in some embodiments, it is possible to effectively clean deposits adhering to an exhaust pipe.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
   rotating an exhaust pipe configured to selectively discharge an exhaust gas generated by a substrate process, so as to set a discharge destination of the exhaust gas to either a first pipe or a second pipe according to elapsed time since a substrate starts to rotate in the substrate process; and
   supplying a cleaning liquid to the exhaust pipe under rotation so as to clean the exhaust pipe,
   wherein the substrate is rotated by a rotary holding part in a first direction and subsequently, in a second direction opposite to the first direction, and
   wherein rotating the exhaust pipe further includes:
      rotating the exhaust pipe at a substrate rotation stop timing where a rotational direction of the substrate is switched from the first direction to the second direction.

2. The method of claim 1, wherein the exhaust pipe is rotated when the substrate is rotated by the rotary holding part configured to rotate the substrate while holding the substrate.

3. The method of claim 2, further comprising:
   supplying a diluted hydrofluoric acid, a hydrofluoric-acid-containing chemical liquid or a mixed liquid of nitric acid and hydrofluoric acid as the cleaning liquid to the exhaust pipe under rotation, and subsequently, supplying a rinse liquid as the cleaning liquid to the exhaust pipe under rotation.

4. The method of claim 1, wherein the exhaust pipe is rotated at the substrate rotation stop timing where the rotational direction of the substrate is switched by the rotary holding part configured to rotate the substrate while holding the substrate.

5. The method of claim 4, further comprising:
   supplying a diluted hydrofluoric acid, a hydrofluoric-acid-containing chemical liquid or a mixed liquid of nitric acid and hydrofluoric acid as the cleaning liquid to the exhaust pipe under rotation, and subsequently, supplying a rinse liquid as the cleaning liquid to the exhaust pipe under rotation.

6. The method of claim 1, further comprising:
   supplying a diluted hydrofluoric acid, a hydrofluoric-acid-containing chemical liquid or a mixed liquid of nitric acid and hydrofluoric acid as the cleaning liquid to the exhaust pipe under rotation, and subsequently, supplying a rinse liquid as the cleaning liquid to the exhaust pipe under rotation.

7. A non-transitory computer-readable recording medium storing a program that causes a substrate processing apparatus to execute the substrate processing method of claim 1.

* * * * *